United States Patent
Tipple et al.

(10) Patent No.: US 11,616,506 B2
(45) Date of Patent: Mar. 28, 2023

(54) HIGH SPEED BUFFER CIRCUIT

(71) Applicant: NXP USA, INC., Austin, TX (US)

(72) Inventors: David Russell Tipple, Leander, TX (US); Mark Douglas Hall, Austin, TX (US)

(73) Assignee: NXP USA, INC., Austin, TX (US)

( * ) Notice: Subject to any disclaimer, the term of this patent is extended or adjusted under 35 U.S.C. 154(b) by 90 days.

(21) Appl. No.: 16/142,404

(22) Filed: Sep. 26, 2018

(65) Prior Publication Data
US 2020/0099377 A1 Mar. 26, 2020

(51) Int. Cl.
*H01L 29/78* (2006.01)
*H03K 19/00* (2006.01)
*H01L 27/12* (2006.01)

(52) U.S. Cl.
CPC ..... *H03K 19/0013* (2013.01); *H01L 27/1207* (2013.01); *H01L 29/783* (2013.01)

(58) Field of Classification Search
CPC .......................... H01L 27/1207; H01L 29/783
See application file for complete search history.

(56) References Cited

U.S. PATENT DOCUMENTS

| | | | | |
|---|---|---|---|---|
| 5,622,885 | A * | 4/1997 | Merrill | H02M 3/07 438/220 |
| 6,087,893 | A * | 7/2000 | Oowaki | G05F 1/46 327/537 |
| 6,177,826 | B1 | 1/2001 | Mashiko et al. | |
| 6,469,568 | B2 | 10/2002 | Toyoyama et al. | |
| 8,629,721 | B2 | 1/2014 | Soussan et al. | |
| 8,803,591 | B1 | 8/2014 | Roy et al. | |
| 9,024,373 | B2 | 5/2015 | Kim et al. | |
| 9,621,033 | B2 * | 4/2017 | Choy | H02M 3/07 |
| 9,716,138 | B1 | 7/2017 | Zang et al. | |
| 9,985,016 | B2 | 5/2018 | Choy et al. | |
| 2002/0066067 | A1 * | 5/2002 | Wang | G06F 30/39 716/112 |
| 2016/0056173 | A1 * | 2/2016 | Masuoka | H01L 27/092 257/203 |

OTHER PUBLICATIONS

Kursun, V., "Domino Logic with Dynamic Body Biased Keeper", Department of Electrical and Computer Engineering, University of Rochester, New York, ESSCIRC 2002.
Niranjan, V., "Dynamic Body Bias Technique, Chapter 2", USET, GGSIPU, 2015.
Srinivasan, R., "Body-Bias Scaling for GLOBALFOUNDRIES 22FDx Technology New Dimension to Explore the Design", Synopsis Users Group (SNUG), Silicon Valley, Mar. 30-31, 2016.

* cited by examiner

Primary Examiner — Mounir S Amer
Assistant Examiner — Alexander Belousov

(57) ABSTRACT

A circuit includes a P-channel transistor formed in a P-well and an N-channel transistor formed in an N-well. The first P-channel transistor has a control electrode connected to the P-well. The N-channel transistor is coupled in series with the P-channel transistor and has a control electrode connected to the N-well. Connecting the control electrodes of the P-channel and N-channel transistors to respective P-well and N-well effectively reduces crowbar current in the circuit.

17 Claims, 2 Drawing Sheets

HIGH SPEED BUFFER CIRCUIT

BACKGROUND

Field

This disclosure relates generally to circuits, and more specifically, to high speed inverter and buffer circuits.

Related Art

For integrated circuits manufactured at advanced semiconductor processing nodes, such as 28 nm (nanometer) feature size and smaller, leakage current between the source and drain terminals of transistors is an increasing problem, especially in very large integrated circuits having a large number of transistors. As transistors operate faster at these advanced processing nodes, crowbar current during signal transitions is also an increasing problem. Therefore, a need exists for reduced leakage current in the case of an open circuit condition.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an inverter circuit that dynamically changes well bias voltage depending on the state of the MOS transistors. By connecting the gate and body terminals together in transistors of the inverter circuit, well biasing of the transistors tracks the gate voltage. This technique enables control of the crowbar current and the total leakage of the inverter circuit, thereby reducing the switching energy and overall leakage current.

Figure 1:
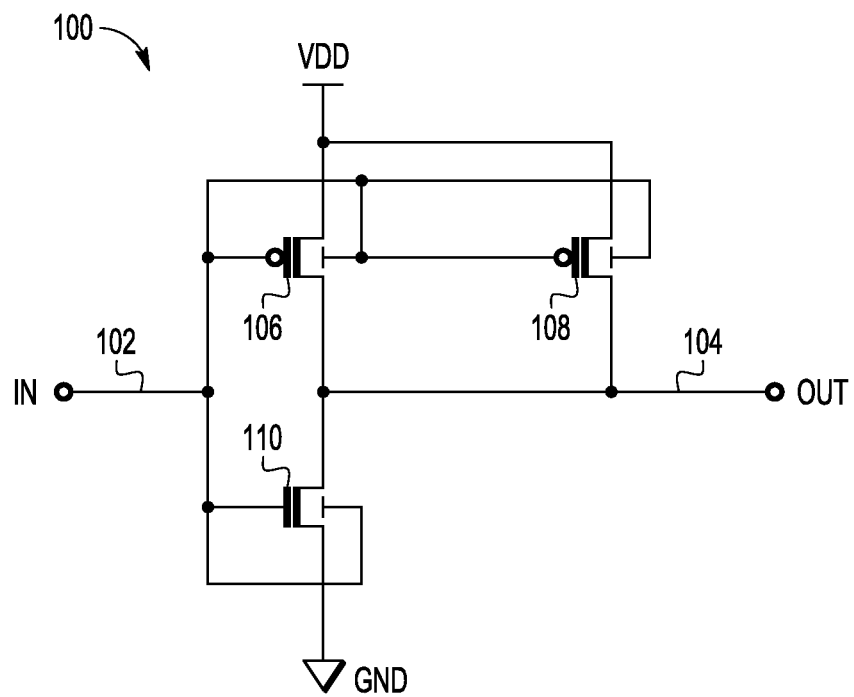
FIG. 1 illustrates, in simplified schematic diagram form, an example high speed inverter circuit for reduced crowbar current in accordance with an embodiment.

FIG. 1 illustrates, in simplified schematic diagram form, an example high speed inverter circuit 100 for reduced crowbar current in accordance with an embodiment. The inverter circuit 100 is formed as part of an integrated circuit (IC) and includes an input terminal 102 labeled IN and an output terminal 104 labeled OUT. The inverter circuit 100 includes P-channel transistors 106-108 and N-channel transistor 110 configured to receive a signal at the IN terminal and provide an inverted signal at the OUT terminal. In this embodiment, transistors 106-110 are formed as low threshold voltage (LVT) transistors in a flipped-well, fully depleted silicon-on-insulator (FDSOI) process with deep N-well. In this embodiment, the LVT transistors have a threshold voltage of approximately 400 millivolts and lower and a shallow channel thickness (e.g., bottom of gate oxide to top of buried oxide) of approximately 70 angstroms and lower.

A first current electrode of transistor 106 is coupled to a first voltage supply terminal labeled VDD. In this embodiment, the VDD supply provides a positive voltage such as an operating voltage of digital circuitry, for example. The VDD supply may be provided on-chip using a regulator or the like, or may be provided from off-chip. A second current electrode of transistor 106 is coupled to a first current electrode of transistor 110 and the output terminal OUT. A control electrode and P-well body terminal of transistor 106 are coupled together and to a control electrode and an N-well body terminal of transistor 110 at the input terminal IN. A second current electrode of transistor 110 is coupled to a second voltage supply terminal labeled GND. In this embodiment, the GND voltage supply provides a ground voltage such as 0 (zero) volts, for example. A first current electrode of transistor 108 is coupled to the first voltage supply terminal labeled VDD and a second current electrode of transistor 108 is coupled to the second current electrode of transistor 106 and the output terminal OUT. A control electrode and P-well body terminal of transistor 108 are coupled together and at the input terminal IN.

In operation, P-well and N-well biasing of transistors 106-110 tracks the gate voltage applied to transistors 106-110. Because the well biasing is dynamically changing based on the input signal, crowbar current (e.g., short circuit current when transistors 106-110 are simultaneously conducting) and leakage current are significantly reduced.

Figure 2:
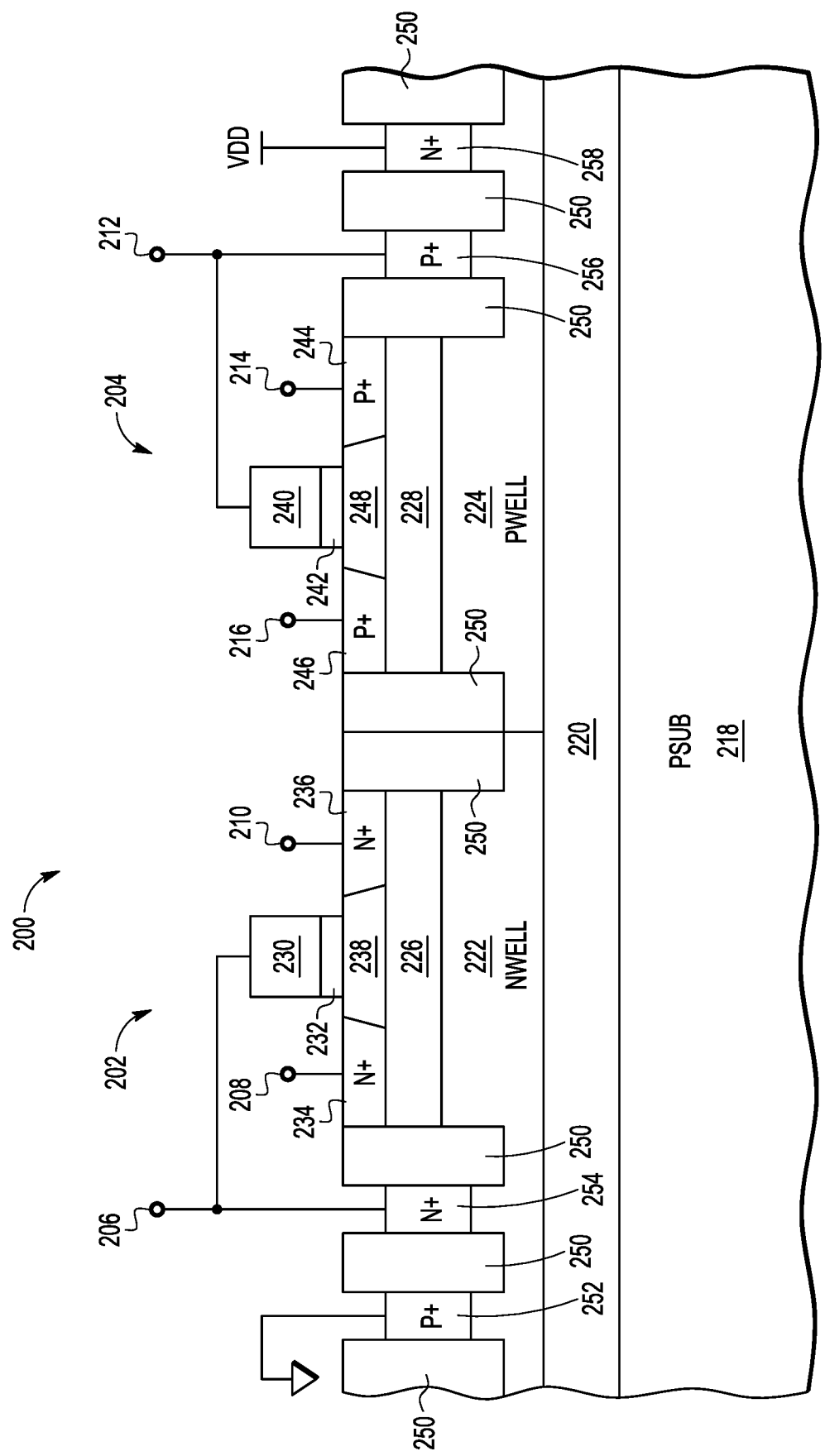
FIG. 2 illustrates, in a simplified cross-sectional view, transistors of the example high speed inverter circuit in accordance with an embodiment.

FIG. 2 illustrates, in a simplified cross-sectional view, a transistor pair 200 of the example high speed inverter circuit 100 in accordance with an embodiment. The transistor pair includes N-channel transistor 202 and P-channel transistor 204 formed as LVT transistors in a flipped-well, FDSOI process with deep N-well. In this embodiment, the LVT transistors have a threshold voltage of approximately 400 millivolts and lower, and a shallow channel thickness (e.g., bottom of gate dielectrics 232, 242 to top of buried oxides 226, 228) of approximately 70 angstroms and lower.

Transistor 202 is formed on a buried oxide (BOX) layer 226 over an isolated N-well 222 and includes a gate electrode 230 formed on a gate dielectric 232. Control electrode (e.g., gate) 230 typically includes a polysilicon material but may include any suitable conductive material. Gate dielectric 232 may be formed from any suitable dielectric material such as a grown or deposited oxide material. Transistor 202 includes a first (N+) current electrode (e.g., source) 234 and a second (N+) current electrode (e.g., drain) 236 formed on opposing sides of control electrode 230, forming a channel 238 below the gate dielectric 232. In this embodiment, first current electrode 234 is coupled to the GND voltage supply as depicted in FIG. 1. Transistor 202 may include other aspects not shown in FIG. 2 such as a gate electrode contact, source/drain electrode contacts, source/drain extension implants and/or sidewall spacers, and the like.

Control electrode 230 of transistor 202 is coupled to the isolated N-well 222 at terminal 206. N+ well tie 254 provides connectivity between terminal 206 and isolated N-well 222. Isolated N-well 222 of transistor 202 is formed within a deep isolation N-well 220. The deep isolation N-well 220 is formed as a deep N-well or buried N-well implant. Deep isolation N-well 220 is coupled to terminal 206 by way of isolated N-well 222. The P-type substrate 218 labeled PSUB is typically coupled to the GND voltage supply by way of substrate ties (not shown). A first antenna diode is formed with P+ region 252 and N-well 222 and coupled to the GND voltage supply. Shallow trench isolation (STI) structures 250 are formed adjacent to outer edges of first current electrode 234 and second current electrode 236, between N+ well tie 254 and P+ region 252, and adjacent to an outer edge of P+ region 252. STI 250 may be formed from any suitable dielectric material such as a deposited oxide material, for example. The control electrode 230 of N-channel transistor 202 may be referred to as a gate terminal, and first and second current electrodes 234 and 236 as source and drain terminals. Terminal 206 provides connection to the gate terminal and N-well 222, terminal 208 provides a connection to the source terminal, and terminal 210 provides connection to the drain terminal.

Transistor 204 is formed on a buried oxide (BOX) layer 228 over an isolated P-well 224 and includes a control electrode 240 formed on a gate dielectric 242. Control electrode (e.g., gate) 240 typically includes a polysilicon material but may include any suitable conductive material. Gate dielectric 242 may be formed from any suitable dielectric material such as a grown or deposited oxide material. Transistor 204 includes a first (P+) current electrode (e.g., source) 244 and a second (P+) current electrode (e.g., drain) 246 formed on opposing sides of control electrode 240, forming a channel 248 below the gate dielectric 242. In this embodiment, first current electrode 244 is coupled to the VDD voltage supply and second current electrode 246 is coupled to second current electrode 236 of transistor 202 forming output OUT as depicted in FIG. 1. Transistor 204 may include other aspects not shown in FIG. 2 such as a gate electrode contact, source/drain electrode contacts, source/drain extension implants and/or sidewall spacers, and the like.

Control electrode 240 of transistor 204 is coupled to the isolated P-well 224 at terminal 212. P+ well tie 256 provides connectivity between terminal 212 and isolated P-well 224. Isolated P-well 224 of transistor 204 is formed within the isolation N-well 220. Deep isolation N-well 220 electrically isolates P-well 224 from the P-type substrate PSUB 218. A second antenna diode is formed with N+ region 258 and P-well 224 and coupled to the VDD voltage supply. STI structures 250 are also formed adjacent to outer edges of first current electrode 244 and second current electrode 246, between P+ well tie 256 and N+ region 258, and adjacent to an outer edge of N+ region 258. The control electrode 240 of P-channel transistor 204 may be referred to as a gate terminal, first and second current electrodes 244 and 246 as source and drain terminals. Terminal 212 provides connection to the gate terminal and P-well 224, terminal 214 provides a connection to the source terminal, and terminal 216 provides connection to the drain terminal.

Figure 3:
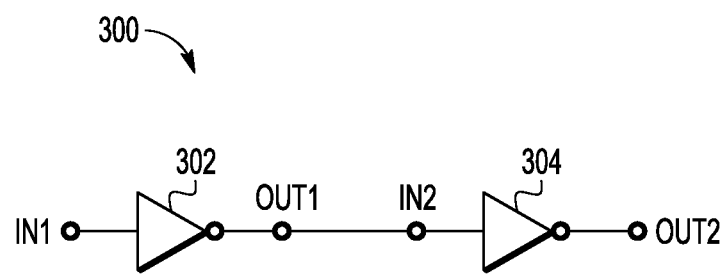
FIG. 3 illustrates, in simplified schematic diagram form, an example non-inverting high speed buffer circuit for reduced crowbar current in accordance with an embodiment.

FIG. 3 illustrates, in simplified schematic diagram form, an example non-inverting high speed buffer circuit 300 for reduced crowbar current in accordance with an embodiment. Non-inverting buffer circuit 300 includes a first high speed inverter 302 coupled in series with a second high speed inverter 304. Each inverter 302 and 304 are formed as an instance or copy of the inverter circuit 100 of FIG. 1. Each inverter 302 and 304 includes an input (IN1, IN2) for receiving an input signal and an output (OUT1, OUT2) for providing an inverted or complement signal.

Input IN1 of inverter circuit 302 is coupled to receive a first input signal and, in turn, inverter circuit 302 provides at the output OUT1 a first output signal that is a complement of the first input signal. The input IN2 of inverter circuit 304 is coupled to the output OUT1 to receive the first output signal (e.g., complement of the first input signal) and, in turn, inverter circuit 304 provides at the output OUT2 a second output signal that is a complement of the first output signal (e.g., a non-inverted buffered version of the first input signal). In operation, P-well and N-well biasing of transistors in inverter circuits 302 and 304 tracks respective gate voltages of the transistors. Because the well biasing is dynamically changing based on the input signals, crowbar currents and leakage currents are significantly reduced.

Generally, there is provided, a circuit including a first P-channel transistor formed in a P-well, the first P-channel transistor having a control electrode connected to the P-well; and a first N-channel transistor coupled in series with the first P-channel transistor, the first N-channel transistor formed in an N-well and having a control electrode connected to the N-well. The P-well and the N-well may be formed over a deep N-well. The control electrode of the first P-channel transistor may be connected to the control electrode of the first N-channel transistor, and wherein a first current electrode of the first P-channel transistor may be connected to a first current electrode of the first N-channel transistor. A second current electrode of the first P-channel transistor may be connected to a first voltage supply terminal and a second current electrode of the first N-channel transistor may be connected to a second voltage supply terminal. The circuit may further include a second P-channel transistor formed in the P-well, the second P-channel transistor having a control electrode connected to the control electrode of the first P-channel transistor. The first P-channel transistor and the first N-channel transistor may be configured to form an inverter circuit. The first P-channel transistor and the first N-channel transistor are implemented as part of a fully depleted silicon-on-insulator (FDSOI) integrated circuit. The circuit may further include a second P-channel transistor formed in a second P-well, the second P-channel transistor includes a control electrode connected to the second P-well and a first current electrode of the first P-channel transistor; and a second N-channel transistor coupled in series with the second P-channel transistor, the second N-channel transistor formed in a second N-well and includes a control electrode connected to the N-well and a first current electrode of the first N-channel transistor. The first and second P-channel transistors and the first and second N-channel transistors may be configured to form a non-inverting buffer circuit.

In another embodiment, there is provided, a circuit including a first P-channel transistor having a gate and a P-well body terminal connected together to receive an input signal; and a first N-channel transistor having a gate and an N-well body terminal connected to the gate of the first P-channel transistor, and a drain connected to the drain of the first P-channel transistor for providing an output signal. The P-well body terminal may be coupled to a P-well formed within a deep N-well and the N-well body terminal may be coupled to an N-well formed within the deep N-well. A first buried oxide region may be formed between the P-well and source/drain regions of the first P-channel transistor and a second buried oxide region may be formed between the N-well and source/drain regions of the first N-channel transistor. The circuit may further include a source of the first P-channel transistor coupled to a first voltage supply terminal and a source of the first N-channel transistor coupled to a second voltage supply terminal. The first P-channel transistor and the first N-channel transistor may be formed on a fully depleted silicon-on-insulator (FDSOI) integrated circuit. The circuit may further include a second P-channel transistor having a gate and a P-well body terminal connected together to receive the output signal; and a second N-channel transistor having a gate and an N-well body terminal connected to the gate of the second P-channel transistor, and a drain connected to the drain of the second P-channel transistor for providing a second output signal.

The first and second P-channel transistors and the first and second N-channel transistors may be configured to form a non-inverting buffer circuit.

In yet another embodiment, there is provided, a circuit including a first P-channel transistor formed in a P-well, the first P-channel transistor having a control electrode connected to the P-well; and a first N-channel transistor formed in an N-well, the first N-channel transistor having a first current electrode coupled to a first current electrode of the first P-channel transistor, and a control electrode connected to the N-well and the control electrode of the first P-channel transistor. The P-well and the N-well may be formed within a deep N-well coupled to ground. The first P-channel transistor and the first N-channel transistor may be characterized as low threshold voltage (LVT) transistors formed in a flipped well arrangement on a fully depleted silicon-on-insulator (FDSOI) integrated circuit. The first P-channel transistor and the first N-channel transistor are configured to form an inverting buffer circuit.

By now it should be appreciated that there has been provided, an inverter circuit that dynamically changes well bias points depending on the state of the MOS transistors. By connecting the gate and body terminals together in transistors of the inverter circuit, well biasing of the transistors tracks the gate voltage. This technique enables control of the crowbar current and the total leakage of the inverter circuit, thereby reducing the switching energy and overall leakage current.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising: a first P-channel transistor formed in a P-well, the first P-channel transistor having a control electrode connected to the P-well;
   an antenna diode formed with the P-well and an N region disposed on the P-well;
   a second P-channel transistor formed in the P-well, the second P-channel transistor having a control electrode connected to the control electrode of the first P-channel transistor and the P-well; and
   a first N-channel transistor coupled in series with the first P-channel transistor, the first N-channel transistor formed in an N-well and having a control electrode connected to the N-well, wherein P-well and N-well biasing of the first P-channel transistor and the first N-channel transistor tracks a gate voltage applied to the first P-channel transistor and the first N-channel transistor based on the first N-channel transistor being adjacent to and coupled in series with the first P-channel transistor, wherein the P-well and the N-well are formed within a deep N-well coupled to ground.

2. The circuit of claim 1, wherein the control electrode of the first P-channel transistor is connected to the control electrode of the first N-channel transistor, and wherein a first current electrode of the first P-channel transistor is connected to a first current electrode of the first N-channel transistor.

3. The circuit of claim 2, wherein a second current electrode of the first P-channel transistor is connected to a first voltage supply terminal and a second current electrode of the first N-channel transistor is connected to a second voltage supply terminal.

4. The circuit of claim 1, wherein P-well biasing of the second P-channel transistor tracks the gate voltage applied to the first P-channel transistor and the first N-channel transistor.

5. The circuit of claim 1, further comprising:
a second antenna diode formed with the N-well and a P region disposed on the N-well.

6. The circuit of claim 1, wherein the first P-channel transistor and the first N-channel transistor are implemented as part of a fully depleted silicon-on-insulator (FDSOI) integrated circuit.

7. The circuit of claim 1, further comprising:
a third P-channel transistor formed in a second P-well, the second P-channel transistor includes a control electrode connected to the second P-well and a first current electrode of the first P-channel transistor; and
a second N-channel transistor coupled in series with the second P-channel transistor, the second N-channel transistor formed in a second N-well and includes a control electrode connected to the N-well and a first current electrode of the first N-channel transistor.

8. The circuit of claim 7, wherein the first and second P-channel transistors and the first and second N-channel transistors are configured to form a non-inverting buffer circuit.

9. A circuit comprising:
a first P-channel transistor having a gate and a P-well body terminal connected together to receive an input signal;
an antenna diode formed with a P-well and an N region disposed on the P-well;
a second P-channel transistor having a gate and a P-well body terminal connected to the gate of the first P-channel transistor; and
a first N-channel transistor having a gate and an N-well body terminal connected to the gate of the first P-channel transistor, and a drain connected to the drain of the first P-channel transistor for providing an output signal, wherein P-well and N-well biasing of the first P-channel transistor and the first N-channel transistor tracks a gate voltage applied to the first P-channel transistor and the first N-channel transistor based on the N-well body terminal of the first N-channel transistor being connected to the gate of the first P-channel transistor, wherein the P-well body terminal is coupled to the P-well and the N-well body terminal is coupled to an N-well and wherein the P-well and N-well are formed within a deep N-well coupled to ground.

10. The circuit of claim 9, wherein a first buried oxide region is formed between the P-well and source/drain regions of the first P-channel transistor and a second buried oxide region is formed between the N-well and source/drain regions of the first N-channel transistor.

11. The circuit of claim 9, further comprising a source of the first P-channel transistor coupled to a first voltage supply terminal and a source of the first N-channel transistor coupled to a second voltage supply terminal.

12. The circuit of claim 9, wherein the first P-channel transistor and the first N-channel transistor are formed on a fully depleted silicon-on-insulator (FDSOI) integrated circuit.

13. The circuit of claim 9, further comprising:
a third P-channel transistor having a gate and a P-well body terminal connected together to receive the output signal; and
a second N-channel transistor having a gate and an N-well body terminal connected to the gate of the second P-channel transistor, and a drain connected to the drain of the second P-channel transistor for providing a second output signal.

14. The circuit of claim 13, wherein the first, second, and third P-channel transistors and the first N-channel transistor and the second N-channel transistor are together configured to form a non-inverting buffer circuit.

15. A circuit comprising:
a first P-channel transistor formed in a P-well, the first P-channel transistor having a control electrode connected to the P-well;
an antenna diode formed with the P-well and an N region disposed on the P-well;
a second P-channel transistor formed in the P-well, the second P-channel transistor having a control electrode connected to the P-well and the control electrode of the first P-channel transistor; and
a first N-channel transistor formed in an N-well, the first N-channel transistor having a first current electrode coupled to a first current electrode of the first P-channel transistor, and a control electrode connected to the N-well and the control electrode of the first P-channel transistor, wherein P-well and N-well biasing of the first P-channel transistor and the first N-channel transistor tracks a gate voltage applied to the first P-channel transistor and the first N-channel transistor based on the first N-channel transistor being adjacent to and coupled in series with the first P-channel transistor, wherein the P-well and the N-well are formed within a deep N-well coupled to ground.

16. The circuit of claim 15, wherein the first P-channel transistor and the first N-channel transistor are characterized as low threshold voltage (LVT) transistors formed in a flipped well arrangement on a fully depleted silicon-on-insulator (FDSOI) integrated circuit.

17. The circuit of claim 15, wherein the first and second P-channel transistors and the first N-channel transistor are configured to form an inverting buffer circuit.

* * * * *